(12) United States Patent
Orginos et al.

(10) Patent No.: US 7,684,267 B2
(45) Date of Patent: Mar. 23, 2010

(54) METHOD AND APPARATUS FOR MEMORY REDUNDANCY IN A MICROPROCESSOR

(75) Inventors: Ioannis Orginos, Sunnyvale, CA (US); Mamun Rashid, Pleasanton, CA (US); Mark E. Steigerwald, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 141 days.

(21) Appl. No.: 12/141,873

(22) Filed: Jun. 18, 2008

(65) Prior Publication Data

US 2009/0316460 A1 Dec. 24, 2009

(51) Int. Cl.
*G11C 7/00* (2006.01)
(52) U.S. Cl. ............... 365/200; 365/49; 365/189.02
(58) Field of Classification Search ............. 365/200, 365/49, 189.02, 189.07
See application file for complete search history.

(56) References Cited

U.S. PATENT DOCUMENTS 6,373,758 B1 * 4/2002 Hughes et al. ............... 365/200
7,336,516 B2 * 2/2008 Tran et al. ................... 365/49.1

* cited by examiner

*Primary Examiner*—Son Dinh
(74) *Attorney, Agent, or Firm*—Osha • Liang LLP

(57) ABSTRACT

An apparatus for redundancy of a memory array includes a primary memory array including a plurality of memory cells, one or more of which are defective. A redundant array includes a CAM array that includes a plurality of memory cells. The CAM array is addressed by the address of a defective memory location within the primary memory array and provides a match identification and a resource identification. The redundant array also includes a translation array wherein an offset to configure an input/output multiplexer is stored. The redundant array also includes a redundant data array including a plurality of memory cells wherein one or more memory cells of the redundant data array are used instead of one or more defective memory cells of the primary array.

20 Claims, 8 Drawing Sheets

METHOD AND APPARATUS FOR MEMORY REDUNDANCY IN A MICROPROCESSOR

BACKGROUND

Modern microprocessors may include one or more cores that are capable of performing operations typically associated with a traditional central processing unit (CPU).

Referring to FIG. 1, a multi-core microprocessor 100 is shown, which comprises one or more die 120 disposed in a mechanical package 110. Each die is comprised of one or more cores 130, one or more primary cache memory arrays 140, one or more secondary cache memory arrays 150, and additional circuitry and connectivity necessary for the proper operation of the microprocessor.

The cache memory arrays comprise a plurality of cache lines comprised of a plurality of bits that are used to store previously accessed instructions or data. Cache memory arrays are typically comprised of fast Static Random Access Memory (SRAM). Cache memory arrays are differentiated by their place in the hierarchical organization of memory within a system. For example, level one (L1) refers to small instruction and/or data cache memory arrays disposed on the microprocessor die and level two (L2) refers to larger instruction and/or data cache memory arrays also disposed on the microprocessor die, but further removed from the core than L1. It is well understood in the art that the hierarchical organization of memory and the use of cache memory arrays reduces main memory latency and improves system performance.

Single-core microprocessors typically have dedicated L1 and L2 instruction and data caches disposed on die. Multi-core microprocessors typically have a mix of dedicated and shared cache memory arrays. For example, Sun Microsystems' high end microprocessor is comprised of four core clusters, each comprised of four cores, resulting in sixteen total cores. Each core within a given core cluster shares L1 instruction and data caches and all core clusters share L2 instruction and data caches. One of ordinary skill in the art will recognize that there are a number of ways in which to organize cache memory arrays disposed in a microprocessor.

Application Specific Integrated Circuits (ASICs), Field-Programmable Gate Arrays (FPGAs), and other semiconductor devices are also comprised of memory arrays utilized for a variety of purposes.

The fabrication of a semiconductor device comprised of a memory array is complicated by defects that are inherent in the fabrication process. There may be a number of defective memory cells within the memory array. Additionally, there may be a number of memory cells that fail to meet minimum electrical requirements and are deemed to be defective. These defects could be a single defective memory cell or multiple defective memory cells. Multiple defective memory cells may be present in a given row and/or column of the memory array. Multiple defective memory cells may span one or more rows and/or one or more columns of the memory array.

Accordingly, certain redundancy schemes have utilized banks of fuses to disable defective cells and enable redundant cells. In post fabrication processing, the defective cells are disabled and redundant cells are enabled through the use of a laser, banks of fuses, and related circuitry. Typically, two banks of fuses are required. A first bank of fuses is utilized to disable defective cells. Defective cells are disabled by triggering one or more fuses with a laser to create open circuits. A second bank of fuses is utilized to enable redundant cells. Redundant cells are enabled by triggering one or more fuses with a laser to create bridge circuits. Other prior art redundancy schemes have utilized shift registers.

SUMMARY

According to one aspect of one or more embodiments of the present invention, an apparatus for redundancy of a memory array comprising: a primary memory array comprising a plurality of memory cells wherein one or more memory cells of the primary array are defective; a redundant array comprising: a CAM array comprising a plurality of memory cells, wherein the addresses of the one or more defective memory locations within the primary array are stored, wherein the CAM array is addressed by the addresses of the one or more defective memory locations within the primary memory array, and wherein the CAM array provides a match identification to a translation array and a resource identification to a redundant data array, the translation array, wherein an offset that configures an input/output multiplexer is stored, wherein the translation array provides the offset to the input/output multiplexer, the redundant data array comprising a plurality of memory cells, wherein one or more memory cells of the redundant data array are used instead of one or more defective memory cells of the primary array; and the input/output multiplexer wherein the input/output multiplexer selectively presents data comprised of data from or to the primary memory array or data from or to the primary memory array and the redundant array.

According to one aspect of one or more embodiments of the present invention, a method for configuring a redundant array for redundancy of a memory array comprising: identifying a defective memory cell within a primary memory array; storing an address corresponding to the address of the defective memory cell within the primary memory array in a CAM array; storing a match identification corresponding to the address of the defective memory cell within the primary memory array in the CAM array; storing a resource identification corresponding to the match identification in the CAM array; and storing an offset corresponding to the resource identification in a translation array.

According to one aspect of one or more embodiments of the present invention, a method for redundancy of a memory array comprising: presenting an address of a memory location within a primary memory array to the primary memory array; presenting the address of the memory location within the primary memory array to a redundant array wherein the redundant array is comprised of a CAM array, a translation array, and a redundant data array; determining whether the address of the memory location within the primary memory array corresponds to a defective memory location within the primary memory array; if the address of the memory location within the primary memory array corresponds to the defective memory location within the primary memory array, presenting a match identification from the CAM array to the translation array, presenting a resource identification from the CAM array to the redundant data array, presenting an offset that corresponds to the resource identification from the translation array to an input/output multiplexer, configuring the input/output multiplexer in accordance with the offset, performing a read or write operation in accordance with the address of the memory location within the primary memory array to the redundant data array; performing the read or a write operation in accordance with the address of the memory location within the primary memory array to the primary memory array; and presenting data corresponding to the address of the memory location within the primary memory array in accordance with the read or write operation.

Other aspects of the present invention will be apparent from the following description and the appended claims.

DETAILED DESCRIPTION

Figure 1:
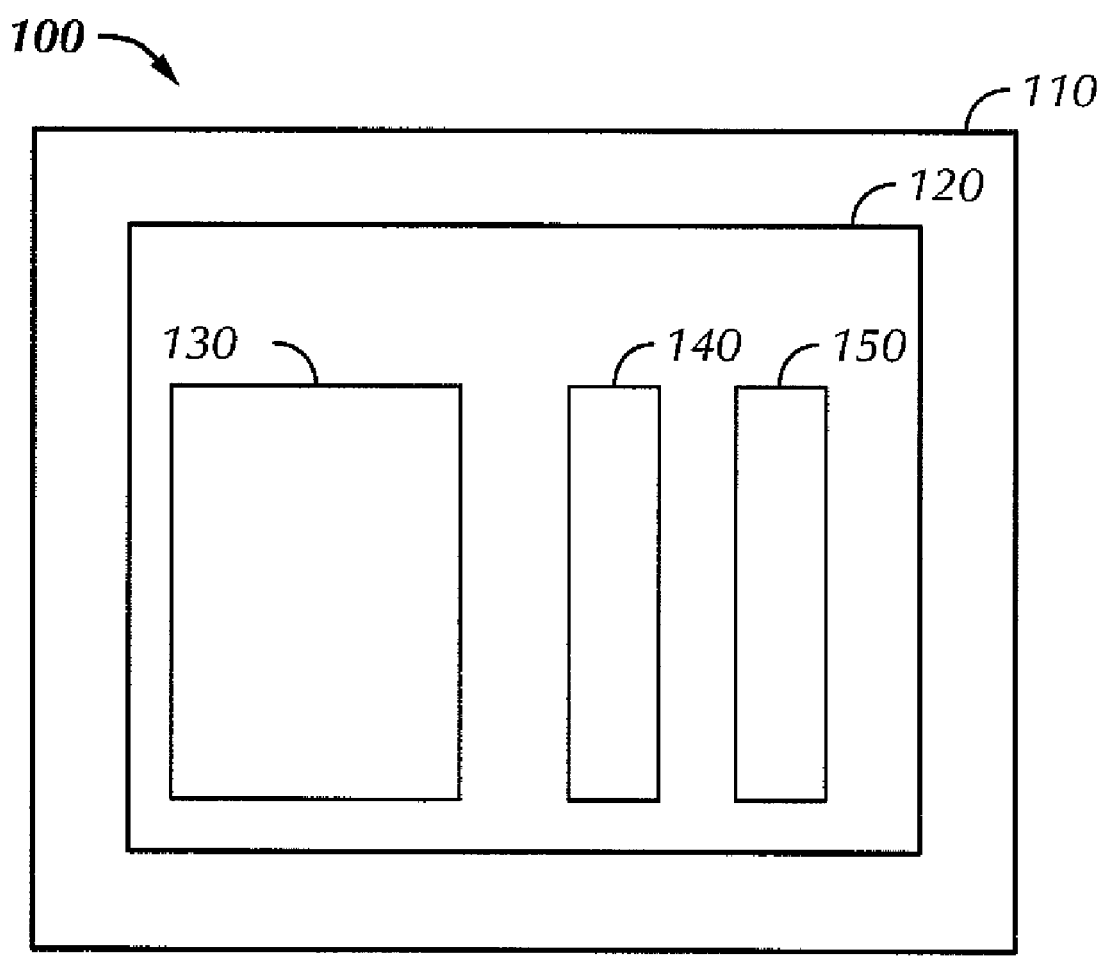
FIG. 1 shows a microprocessor comprised of a plurality of memory arrays.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

Figure 2:
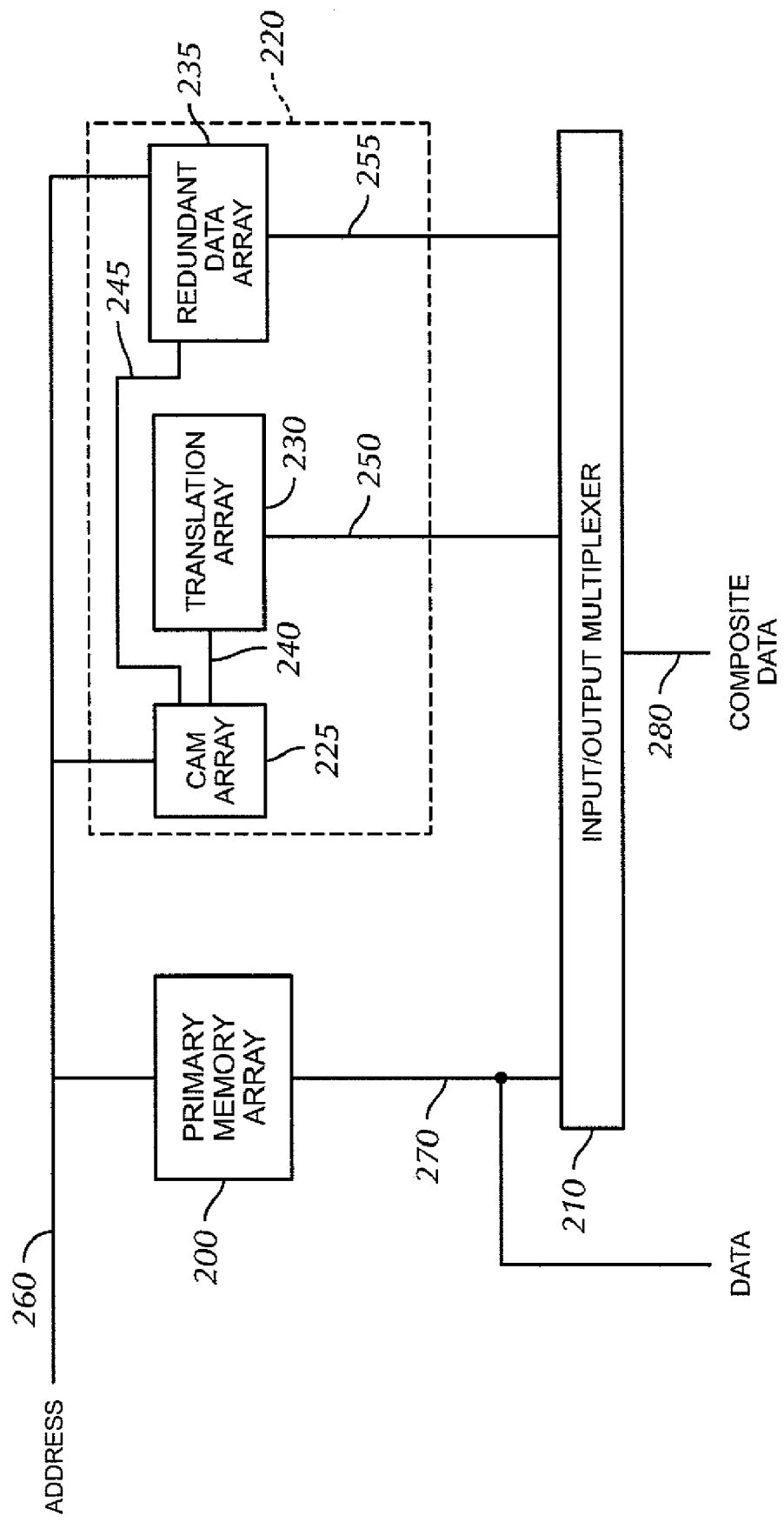
FIG. 2 shows an apparatus for redundancy of a memory array in accordance with an embodiment of the present invention.

FIG. 2 shows an apparatus for redundancy of a memory array in accordance with one or more embodiments of the present invention.

A primary memory array 200 is comprised of a plurality of memory cells. One or more memory cells of the primary memory array 200 may be defective. Thus, a redundant array 220 comprised of a content-addressable memory (CAM) array 225, a translation array 230, and a redundant data array 250 and an input/output multiplexer 210 comprised of a plurality of multiplexers is also included. The CAM array 225 is configured to store defective memory cell locations within the primary memory array 200 and other data necessary as part of the redundancy scheme described in detail below. The translation array 230 is configured to store offset 250 in accordance with the defective memory cell locations stored in the CAM array 225. The translation array 230 could be a register file. An address 260 of a memory location within the primary memory array 200 is presented to the primary memory array 200 and the redundant array 220 as part of a read or a write operation.

In the case of the read operation (from primary memory), the primary memory array 200 outputs data 270 to the input/output multiplexer 210 in accordance with the address 260 of the memory location within the primary memory array 200. If the address 260 of the memory location within the primary memory array 200 is present in the CAM array 225, the CAM array 225 presents a match identification 240 to the translation array 230 and a resource identification 245 to the redundant data array 235. The resource identification 245 may be the match identification 240. The translation array 230 presents an offset 250 to the input/output multiplexer 210 in accordance with the match identification 240. The redundant data array 235 utilizes the resource identification 245 and the address 260 of the memory location within the primary memory array 200 to output data 255 to the input/output multiplexer 210 in accordance with the read operation. The input/output multiplexer 210 utilizes the offset 250, data 270 from the primary memory array 200, and data 255 from the redundant data array 235 to output composite data 280. Composite data 280 is composed of data 270 or a combination of a subset of data 270 and data 255 in accordance with the offset 250.

In the case of a write operation (to primary memory), data 270 is input directly to the primary memory array 200 and composite data 280 is input to the input/output multiplexer 210 in accordance with the address 260 of the memory location within the primary memory array 200. Composite data 280 is data 270 for the purpose of the write operation. If the address 260 of the memory location within the primary memory array 200 is present in the CAM array 225, the CAM array 225 presents the match identification 240 to the translation array 230 and the resource identification 245 to the redundant data array 235. The translation array 230 utilizes the match identification 240 to present the offset 250 to the input/output multiplexer 210. The input/output multiplexer 210 utilizes the offset 250 to selectively output a subset of composite data 280 to the redundant data array 235. The redundant data array 235 utilizes the resource identification 245 and the address 260 of the memory location within the primary memory array 200 to input data 255 from the input/output multiplexer 210 to the redundant data array 235 in accordance with the write operation.

Figure 3:
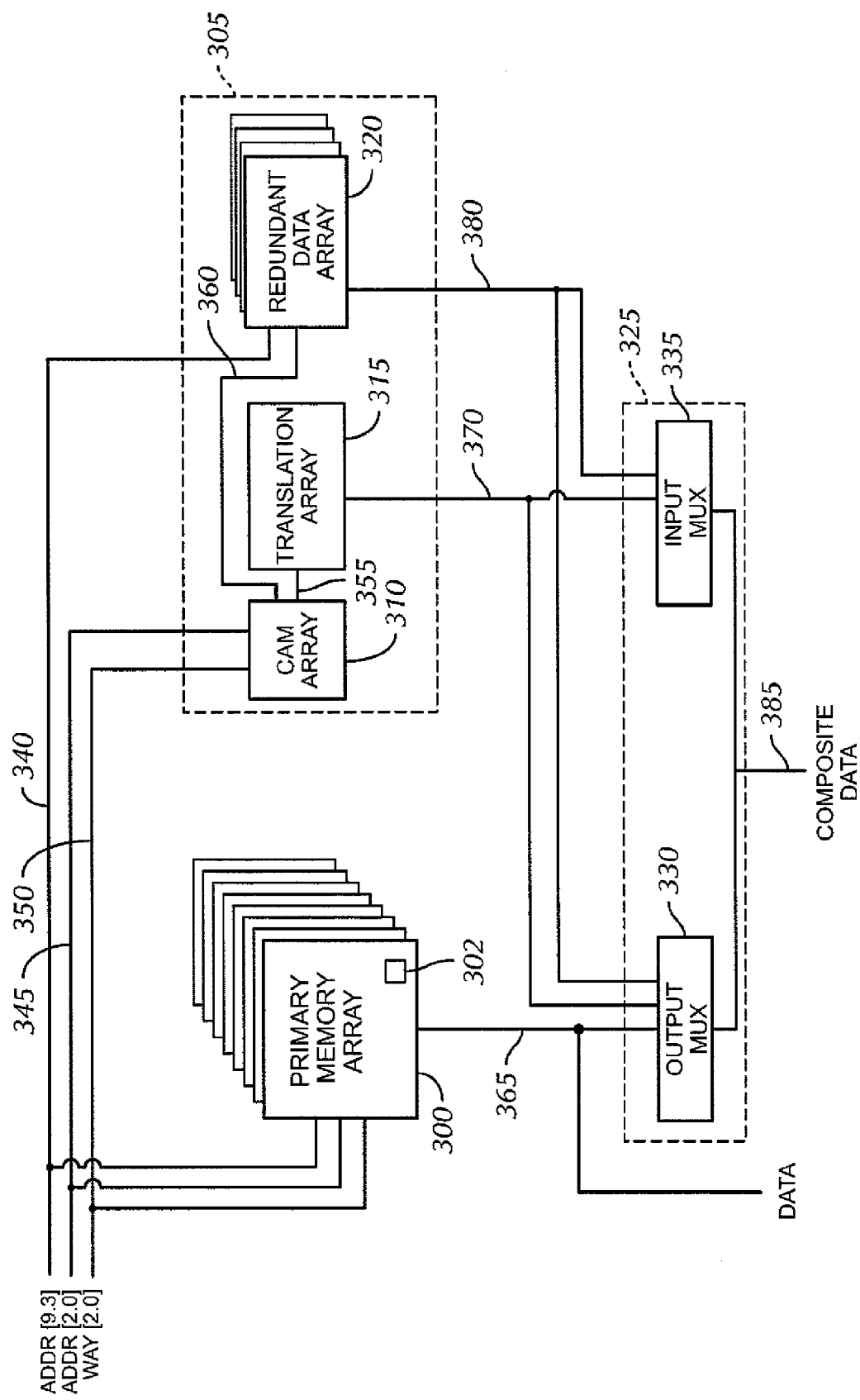
FIG. 3 shows an apparatus for column redundancy of a memory array in accordance with an embodiment of the present invention.

FIG. 3 shows an apparatus for column redundancy of a memory array in accordance with one or more embodiments of the present invention.

A primary memory array 300 is comprised of a plurality of memory cells. The primary memory array 300 could be organized as a 1024-line, 64-bits-per-line, 8-way cache array. One of ordinary skill in the art will appreciate that a set-associative cache scheme divides a cache array into equal sections called ways that each function as a small direct-mapped cache array. The primary memory array 300 could be logically divided into a plurality of sub-blocks 302 of 128-lines, 128-bits-per-line arrays. One or more memory cells of the primary memory array 300 may be defective. Thus, a redundant array 305 comprised of a CAM array 310, a translation array 315, and a redundant data array 320 and an input/output multiplexer 325 is also included.

The CAM array 310 is organized as a 4-line, 6-bits-per-line array. The CAM array 310 is configured to store defective memory cell locations within the primary memory array 300 and other data necessary as part of the redundancy scheme described in detail below. The translation array 315 is organized as a 4-line, 8-bits-per-line array in a one hot encoded configuration. The translation array 315 is configured to store offset 370 in accordance with the defective memory cell locations stored in the CAM array 310. As such, the translation array 315 provides an offset 370 to the input/output multiplexer 325 that selects one of eight sets of 8-bits in the 64-bit row. The translation array 315 could be a register file. The redundant data array 320 is organized as a 4-resource, 128-lines-per-resource, 8-bits-per-line array. An input/output multiplexer 325 is comprised of an input multiplexer 335 and an output multiplexer 330. One of ordinary skill in the art will appreciate that the primary memory array 300, sub-blocks 302, CAM array 310, translation array 315, and redundant data array 320 could be organized in various other manners in accordance with one or more embodiments of the present invention.

An address of a memory location within the primary memory array 300 is comprised of 13-bits that could be logically divided into three groups, ADDR[9:3] 340, ADDR[2:0] 345, and WAY[2:0] 350, to clarify the operation of one or more embodiments of the present invention. The 10-bits represented by ADDR[9:3] 340 and ADDR[2:0] 345 can uniquely identify one of the 1024 lines of the primary memory array 300. The 3-bits represented by WAY[2:0] 350 can uniquely identify one of the eight ways of the primary memory array 300. The address, ADDR[9:3] 340, ADDR[2:0] 345, and WAY[2:0] 350, of the memory location within the primary memory array 300 is presented to the primary memory array 300 as part of a read or write operation. A portion, ADDR[2:0] 345 and WAY[2:0] 350, of the address of the memory location within the primary memory array 300 is presented to the CAM array 310 as part of the read or write operation. A portion, ADDR[9:3] 340, of the address of the memory location within the primary memory array 300 is presented to the redundant data array 320 as part of the read or write operation.

In the case of the read operation, the primary memory array 300 outputs 64-bits of data 365 to the output multiplexer 330 in accordance with the address, ADDR[9:3] 340, ADDR[2:0] 345, and WAY[2:0] 350, of the memory location within the primary memory array 300. If a portion, ADDR[2:0] 345 and WAY[2:0] 350, of the address of the memory location within the primary memory array 300 is present in the CAM array 310, the CAM array 310 presents a 4-bit match identification 355 to the translation array 315 to select one of the four lines called offset 370, each of which can have a value as that shown in Table 1. In one or more embodiments of the present invention, the match identification 355 is one-hot encoded, meaning the possible combinations are {0001, 0010, 0100, and 1000}. The translation array 315 presents an 8-bit offset 370 to the output multiplexer 330 as shown in Table 1. Once configured by the offset 370, the output multiplexer 330, in accordance with Table 1, allows for the replacement of 8-bits of the 64-bit row provided by the primary memory array 300 with 8-bits of data from the redundant data array 320 to produce 64-bit composite data 385 as described in detail below. One of ordinary skill in the art will recognize that the offset 370 and output multiplexer 330 could be configured in a variety of other manners in accordance with one or more embodiments of the present invention.

TABLE 1

Offset Configuration of Multiplexer.

| Offset [7:0] | Resulting Multiplexer Configuration |
| --- | --- |
| 00000001 | b0/b2/b4/b6/b8/b10/b12/b14 |
| 00000010 | b16/b18/b20/b22/b24/b26/b28/b30 |
| 00000100 | b1/b3/b5/b7/b9/b11/b13/b15 |
| 00001000 | b17/b19/b21/b23/b25/b27/b29/b31 |
| 00010000 | b32/b34/b36/b38/b40/b42/b44/b46 |
| 00100000 | b48/b50/b52/b54/b56/b58/b60/b62 |
| 01000000 | b33/b35/b37/b39/b41/b43/b45/b47 |
| 10000000 | b49/b51/b53/b55/b57/b59/b61/b63 |

The CAM array 310 presents the resource identification 360 to the redundant data array 320. The resource identification 360 could be the match identification 355. The redundant data array 320 utilizes the resource identification 360 to select one of the four resources of the redundant data array 320. The redundant data array 320 utilizes a portion, ADDR[9:3] 340, of the address of the memory location within the primary memory array 300 corresponding to the selected resource to output an 8-bit line of data 380 to the output multiplexer 330 in accordance with the read operation. The output multiplexer 330 utilizes the offset 370, 64-bits of data 365 from the primary memory array, and 8-bits of data 380 from the redundant data array 320, to output 64-bit composite data 385. Composite data 385 is composed of data 365 or data 365 with 8-bits selectively replaced with data 380 in accordance with the offset 370 provided to the input/output multiplexer 325.

In the case of the write operation, data 365 is input directly to the primary memory array 300 and composite data 385 is input to the input multiplexer 335 in accordance with the address, ADDR[9:3] 340, ADDR[2:0] 345, and WAY[2:0] 350, of a memory location within the primary memory array 300. Composite data 385 is data 365 for the purpose of the write operation. If a portion, ADDR[2:0] 345 and WAY[2:0] 350, of the address of the memory location within the primary memory array 300 is present in the CAM array 310, the CAM array 310 presents a match identification 355 to the translation array 315 and a resource identification 360 to the redundant data array 320. The translation array 315 utilizes the match identification 355 to present an offset 370 to the input multiplexer 335. The input multiplexer 335 utilizes the offset 370 to selectively output one of eight sets of 8-bits of composite data 385 to the redundant data array 320. The redundant data array 320 utilizes the resource identification 360 and a portion, ADDR[9:3] 340, of the address of the memory location within the primary memory array 300 to input data 380 from the input multiplexer 335 to the redundant array 320 in accordance with the write operation.

Figure 4:
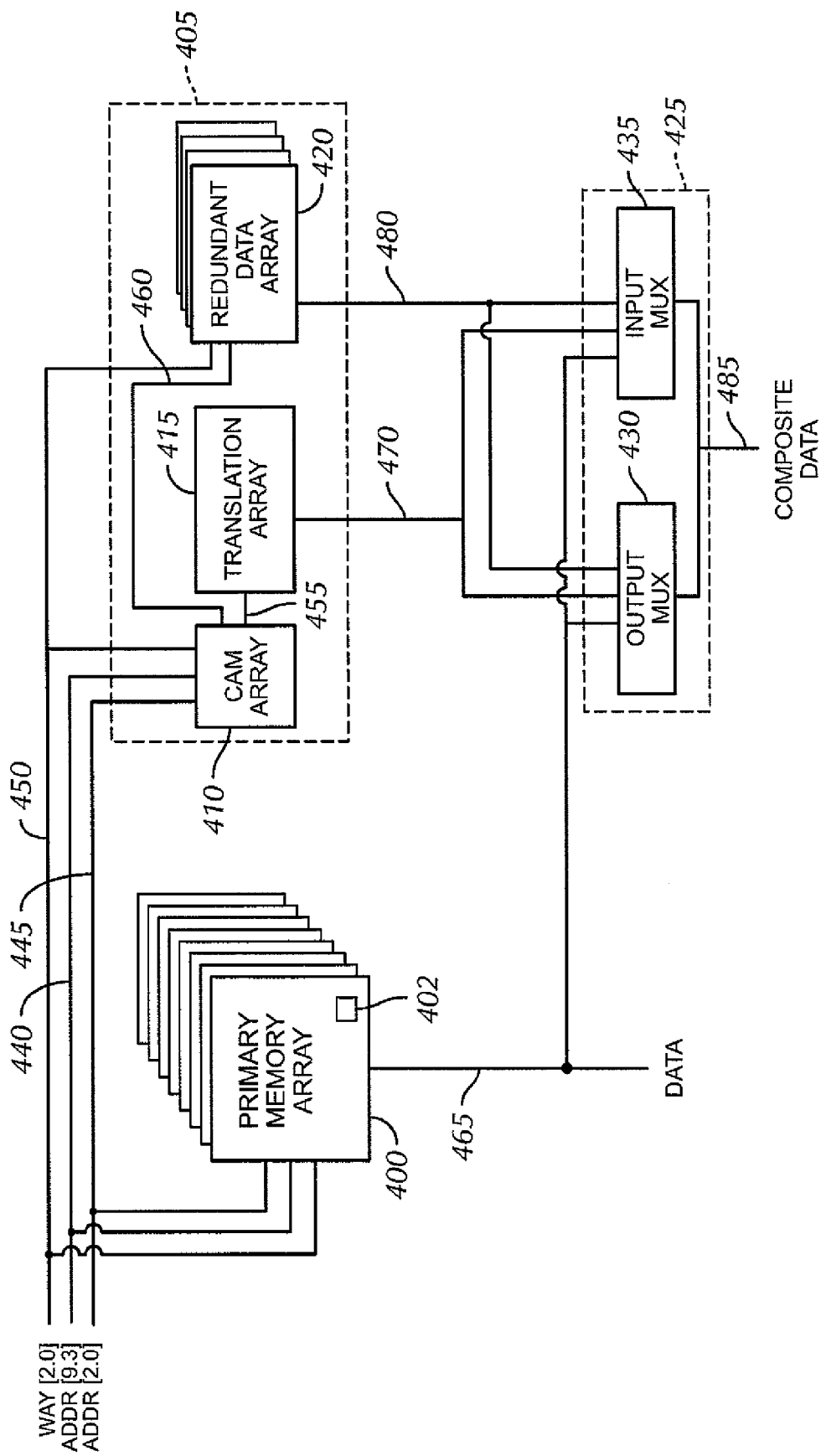
FIG. 4 shows an apparatus for row redundancy of a memory array in accordance with an embodiment of the present invention.

FIG. 4 shows an apparatus for row redundancy of a memory array in accordance with one or more embodiments of the present invention.

A primary memory array 400 is comprised of a plurality of memory cells. The primary memory array 400 could be organized as a 1024-line, 64-bits-per-line, 8-way cache array. The primary memory array 400 could be logically divided into a plurality of sub-blocks 402 of 128-lines, 128-bits-per-line arrays. One or more memory cells of the primary memory array 400 may be defective. Thus, a redundant array 405 comprised of a CAM array 410, a translation array 415, and a redundant data array 420 and an input/output multiplexer 425 is also included.

The CAM array 410 is organized as a 4-line, 11-bits-per-line array. The CAM array 410 is configured to store defective memory cell locations within the primary memory array 400 and other data necessary as part of the redundancy scheme described in detail below. The translation array 415 is organized as a 4-line, 4-bits-per-line array in a one hot encoded configuration. The translation array 415 is configured to store offset 470 in accordance with the defective memory cell locations stored in the CAM array 410. As such, the translation array 415 provides an offset 470 to the input/output multiplexer 425 that selects one of four sets of 16-bits in the 64-bit row. The translation array 415 could be a register file. The redundant data array 420 is organized as a 4-resource, 4-lines-per-resource, 16-bits-per-line array. An input/output multiplexer 425 is comprised of an input multiplexer 435 and an output multiplexer 430. One of ordinary skill in the art will appreciate that the primary memory array 400, sub-blocks 402, CAM array 410, translation array 415, and redundant data array 420 could be organized in various other manners in accordance with one or more embodiments of the present invention.

An address of a memory location within the primary memory array 400 is comprised of 13-bits that could be logically divided into three groups, ADDR[9:3] 440, ADDR [2:0] 445, and WAY[2:0] 450, to clarify the operation of one or more embodiments of the present invention. The 10-bits represented by ADDR[9:3] 440 and ADDR[2:0] 445 can uniquely identify one of the 1024 lines of the primary memory array 400. The 3-bits represented by WAY[2:0] 450 can uniquely identify one of the eight ways of the primary memory array 400. The address, ADDR[9:3] 440, ADDR[2: 0] 445, and WAY[2:0] 450, of the memory location within the primary memory array 400 is presented to the primary memory array 400 as part of the read or write operation. The address, ADDR[9:3] 440, ADDR[2:0] 445, and a portion of WAY[2:0] 450, of a memory location within the primary memory array 400 is presented to the CAM array 410 as part of the read or write operation. A portion, part of WAY[2:0] 450, of the address of a memory location within the primary memory array 400 and resource identification 460 is presented to the redundant data array 420 as part of a read or write operation.

In the case of the read operation, the primary memory array 400 outputs 64-bits of data 465 to the output multiplexer 430 in accordance with the address, ADDR[9:3] 440, ADDR[2:0] 445, and WAY[2:0] 450, of the memory location within the primary memory array 400. If the address, ADDR[9:3] 440, ADDR[2:0] 445, and WAY[2:0] 450, of the memory location within the primary memory array 400 is present in the CAM array 410, the CAM array 410 presents a 4-bit match identification 455 to the translation array 415 to select one of the four lines called offset 470, each of which can have a value as that shown in Table 2. In one or more embodiments of the present invention, the match identification 455 is one-hot encoded, meaning the possible combinations are {0001, 0010, 0100, and 1000}. The translation array 415 presents a 4-bit offset 470 to the output multiplexer 430. Once configured by the offset 470, the output multiplexer 430, in accordance with Table 2, allows for the replacement of 16-bits of the 64-bit row provided by the primary memory array 400 with 16-bits of data from the redundant data array 420 to produce 64-bit composite data 485 as described in detail below. One of ordinary skill in the art will recognize that the offset 470 and multiplexer 430 could be configured in a variety of other manners in accordance with one or more embodiments of the present invention.

TABLE 2

Offset Configuration for Multiplexer.

| Offset[3:0] | Resulting Multiplexer Configuration |
| --- | --- |
| 0001 | b0/b2/b4/b6/b8/b10/b12/b14 |
|  | b16/b18/b20/b22/b24/b26/b28/b30 |
| 0010 | b1/b3/b5/b7/b9/b11/b13/b15 |
|  | b17/b19/b21/b23/b25/b27/b29/b31 |
| 0100 | b32/b34/b36/b38/b40/b42/b44/b46 |
|  | b48/b50/b52/b54/b56/b58/b60/b62 |
| 1000 | b33/b35/b37/b39/b41/b43/b45/b47 |
|  | b49/b51/b53/b55/b57/b59/b61/b63 |

The CAM array 410 presents the resource identification 460 to the redundant data array 420. The resource identification 460 could be the match identification 455. The redundant data array 420 utilizes the resource identification 460 to select one of the four resources of the redundant data array 420. The redundant data array 420 utilizes a portion, part of WAY[2:0] 450, of the address of the memory location within the primary memory array 400 corresponding to the selected resource to output a 16-bit line of data 480 to the output multiplexer 430 in accordance with the read operation. The output multiplexer 430 utilizes the offset 470, 64-bits of data 465 from the primary memory array, and 16-bits of data 480 from the redundant data array 420, to output 64-bits composite data 485. Composite data 485 is composed of data 465 or data 465 with 16-bits selectively replaced with data 480 in accordance with the offset 470 provided to the input/output multiplexer 425.

In the case of the write operation, data 465 is input directly to the primary memory array 400 and composite data 485 is input to the input multiplexer 435 in accordance with the address, ADDR[9:3] 440, ADDR[2:0] 445, and WAY[2:0] 450, of a memory location within the primary memory array 400. Composite data 485 is data 465 for the purpose of the write operation. The input multiplexer 435 outputs data 465 to the primary memory array 400 in accordance with the address, ADDR[9:3] 440, ADDR[2:0] 445, and WAY[2:0] 450, of the memory location within the primary memory array 400. If the address, ADDR[9:3] 440, ADDR[2:0] 445, and WAY[2:0] 450, of the memory location within the primary memory array 400 is present in the CAM array 410, the CAM array 410 presents a match identification 455 to the translation array 415 and a resource identification 460 to the redundant data array 420. The translation array 415 utilizes the match identification 455 to present an offset 470 to the input multiplexer 435. The input multiplexer 435 utilizes the offset 470 to selectively output one of four groups of 16-bits of composite data 485 to the redundant data array 420. The redundant data array 420 utilizes the resource identification 460 and a portion, part of WAY[2:0] 450, of the address of the memory location within the primary memory array 400 to input data 480 from the input multiplexer 435 to the redundant data array 420 in accordance with the write operation.

Figure 5:
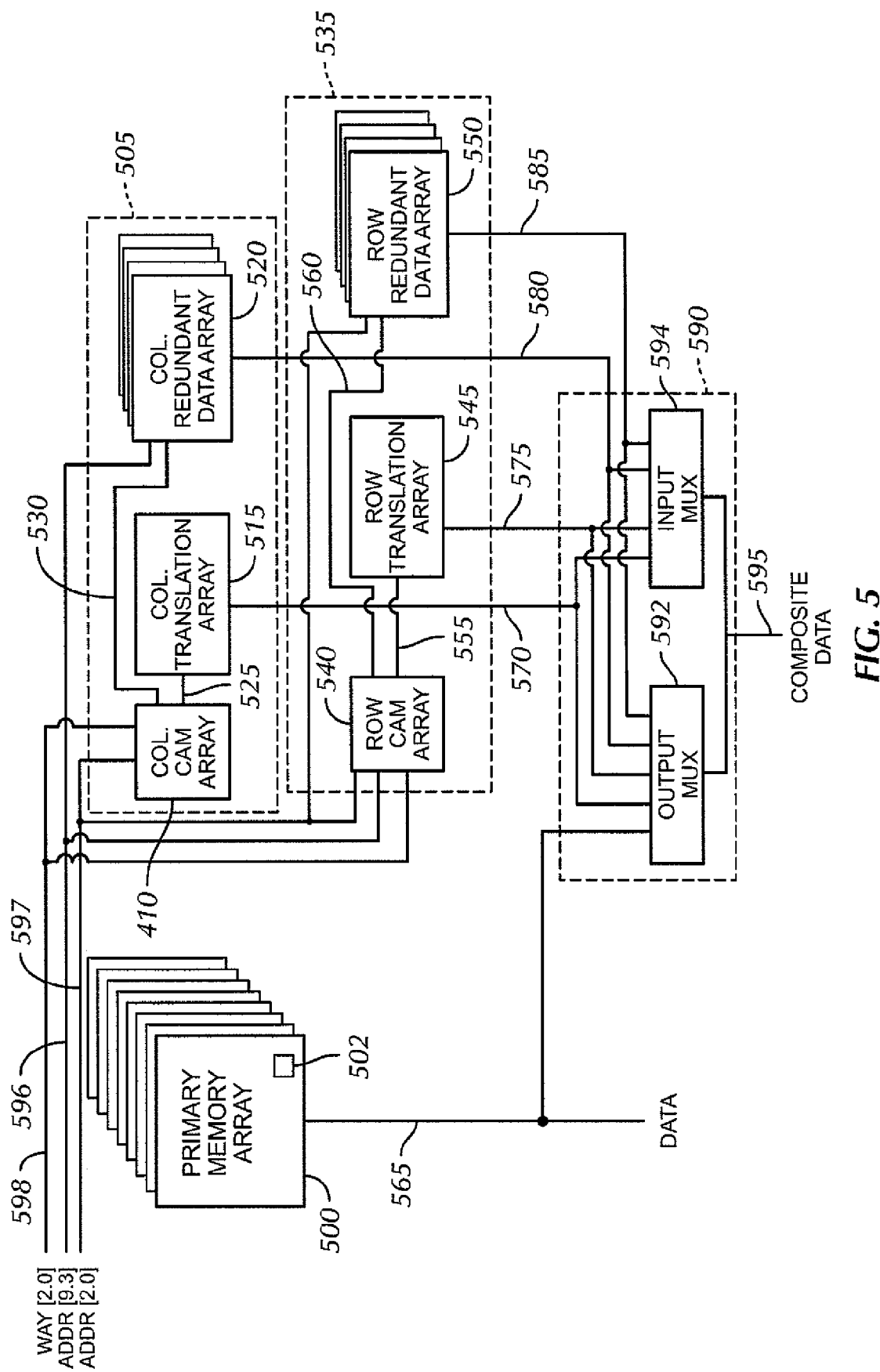
FIG. 5 shows an apparatus for column and row redundancy of a memory array in accordance with an embodiment of the present invention.

FIG. 5 shows an apparatus for column and row redundancy of a memory array in accordance with one or more embodiments of the present invention.

A primary memory array 500 is comprised of a plurality of memory cells. The primary memory array 500 could be organized as a 1024-line, 64-bits-per-line, 8-way cache array. The primary memory array 500 could be logically divided into a plurality of sub-blocks 502 of 128-lines, 128-bits-per-line arrays. One or more memory cells of the primary memory array 500 may be defective. Thus, a column redundant array 505 comprised of a column CAM array 510, a column translation array 515, and a column redundant data array 520 is included. In addition, a row redundant array 535 comprised of a row CAM array 540, a row translation array 545, and a row redundant array 550 is included. Also, an input/output multiplexer 590 is included.

The column CAM array 510 is organized as a 4-line, 6-bits-per-line array. The column CAM array 510 is configured to store defective memory cell locations within the primary memory array 500 and other data necessary as part of the redundancy scheme described in detail below. The column translation array 515 is organized as a 4-line, 8-bits-per-line array in a one hot encoded configuration. The column translation array 515 is configured to store column offset 570 in accordance with the defective memory cell locations stored in the column CAM array 510. As such, the column translation array 515 provides an column offset 570 to the input/output multiplexer 590 that selects one of eight sets of 8-bits in the 64-bit row. The column translation array 515 could be a register file. The column redundant data array 320 is organized as a 4-resource, 128-lines-per-resource, 8-bits-per-line array.

The row CAM array 540 is organized as a 4-line, 11-bits-per-line array. The row CAM array 540 is configured to store defective memory cell locations within the primary memory array 500 and other data necessary as part of the redundancy scheme described in detail below. The row translation array 545 is organized as a 4-line, 4-bits-per-line array in a one hot encoded configuration. The row translation array 545 is configured to store row offset 575 in accordance with the defective memory cell locations stored in the row CAM array 540. As such, the row translation array 545 provides a row offset 575 to the input/output multiplexer 590 that selects one of four sets of 16-bits in the 64-bit row. The row translation array 545 could be a register file. The row redundant data array 550 is organized as a 4-resource, 4-lines-per-resource, 16-bits-per-line array.

An input/output multiplexer 590 is comprised of input multiplexer 594 and output multiplexer 592. One of ordinary skill in the art will appreciate that the primary memory array 500, column CAM array 510, column translation array 515, column redundant data array 520, row CAM array 540, row translation array 545, and row redundant array 550 could be organized in various other manners in accordance with one or more embodiments of the present invention.

An address of a memory location within the primary memory array 500 is comprised of 13-bits that could be logically divided into three groups, ADDR[9:3] 596, ADDR[2:0] 597, and WAY[2:0] 598, to clarify the operation of one or more embodiments of the present invention. The 10-bits represented by ADDR[9:3] 596 and ADDR[2:0] 597 can uniquely identify one of the 1024 lines of the primary memory array 500. The 3-bits represented by WAY[2:0] 598 can uniquely identify one of the eight ways of the primary memory array 500. The address, ADDR[9:3] 596, ADDR[2:0] 597, and WAY[2:0] 598, of the memory location within the primary memory array 500 is presented to the primary memory array 500 as part of the read or write operation.

A portion, ADDR[2:0] 597 and WAY[2:0] 598, of the address of a memory location within the primary memory array 500 is presented to the column CAM array 510 as part of the read or write operation. A portion, ADDR[9:3] 596, of the address of a memory location within the primary memory array 500 is presented to the column redundant data array 520 as part of a read or write operation.

The address ADDR[9:3] 596, ADDR[2:0] 597, and WAY[2:0] 598 of a memory location within the primary memory array 500 is presented to the row CAM array 540 as part of the read or write operation. A portion, WAY[2:0] 598, of the address of a memory location within the primary memory array 500 and resource identification 560 is presented to the row redundant data array 550 as part of a read or write operation.

In the case of the read operation, the primary memory array 500 outputs 64-bits of data 565 to the output multiplexer 592 in accordance with the address, ADDR[9:3] 596, ADDR[2:0] 597, and WAY[2:0] 598, of the memory location within the primary memory array 500.

If a portion, ADDR[2:0] 597 and WAY[2:0] 598, of the address of the memory location within the primary memory array 500 is present in the column CAM array 510, the column CAM array 510 presents an 4-bit column match identification 525 to the column translation array 515 to select one of the four lines called column offset 570, each of which can have a value as that shown in Table 1. In one or more embodiments, the column match identification 525 is one-hot encoded, meaning the possible combinations are {0001, 0010, 0100, and 1000}. The column translation array 515 presents an 8-bit column offset 570 to the output multiplexer 592 as shown in Table 1. Once configured by the column offset 570, the output multiplexer 592, in accordance with Table 1, allows for the replacement of 8-bits of the 64-bit row provided by the primary memory array 500 with 8-bits of data from the column redundant data array 520 to produce 64-bit composite data 595 as described in detail below. One of ordinary skill in the art will recognize that the column offset 570 could be configured in a variety of other manners in accordance with one or more embodiments of the present invention.

The column CAM array 510 presents the column resource identification 530 to the column redundant data array 520. The column resource identification 530 could be the column match identification 525. The column redundant data array 520 utilizes the column resource identification 530 to select one of the four resources of the column redundant data array 520. The column redundant data array 520 utilizes a portion, ADDR[9:3] 596, of the address of the memory location within the primary memory array 500 corresponding to the selected resource to output 8-bits of data 580 to the output multiplexer 592 in accordance with the read operation. The output multiplexer 592 utilizes the column offset 570, 64-bits of data 565 from the primary memory array 500, and 8-bits of column data 580 from the column redundant data array 520, to output 64-bits composite data 595. Composite data 595 is composed of data 565 or data 565 with 8-bits selectively replaced with column data 580 in accordance with the column offset 570 provided to the input/output multiplexer 590.

If the address, ADDR[9:3] 596, ADDR[2:0] 597, and WAY[2:0] 598, of the address of the memory location within the primary memory array 500 is present in the row CAM array 540, the row CAM array 540 presents a 4-bit row match identification 555 to the row translation array 545 to select one of the four lines called row offset 575, each of which can have a value as that shown in Table 2. In one or more embodiments, the row match identification 555 is one-hot encoded, meaning the possible combinations are {0001, 0010, 0100, and 1000}. The row translation array 545 presents a 4-bit row offset 575 to the output multiplexer. Once configured by the row offset 575, the output multiplexer 592, in accordance with Table 2, allows for the replacement of 16-bits of the 64-bit row provided by the primary memory array 500 with 16-bits of row data from the row redundant data array 550 to produce 64-bit composite data 595 as described in more detail below. One of ordinary skill in the art will recognize that row offset 575 and output multiplexer 592 could be configured in a variety of other manners in accordance with one or more embodiments of the present invention.

The row CAM array 540 presents the row resource identification 560 to the row redundant data array 550. The row resource identification 560 could be the row match identification 555. The row redundant data array 550 utilizes the row resource identification 560 to select one of the four resources of the row redundant array 550. The row redundant data array 550 utilizes a portion, part of WAY[2:0] 598, of the address of the memory location within the primary memory array 500 corresponding to the selected resource to output a 16-bit line of row data 585 to the output multiplexer 592 in accordance with the read operation. The output multiplexer 592 utilizes the row offset 575, 64-bits of data 565 from the primary memory array, and 16-bits of row data 585 from the row redundant data array 550, to output 64-bits composite data 595. Composite data 595 is composed of data 565 or data 565 with 16-bits selectively replaced with row data 585 in accordance with the row offset 575 provided to the input/output multiplexer 590.

One of ordinary skill in the art will appreciate that data from the column redundant data array and the row redundant data array could be output as part of the same read operation in accordance with one or more embodiments of the present invention. In that case, composite data 595 could be composed of data 565 with 8-bits selectively replaced with column data 580 and 16-bits selectively replaced with row data 585.

In the case of a write operation, data 565 is input directly to the primary memory array 500 and composite data 595 is input to the input multiplexer 594 in accordance with the address, ADDR[9:3] 596, ADDR[2:0] 597, and WAY[2:0] 598, of a memory location within the primary memory array 500.

If a portion, ADDR[2:0] 597 and WAY[2:0] 598, of the address of the memory location within the primary memory array 500 is present in the column CAM array 510, the column CAM array 510 presents a column match identification 525 to the column translation array 515 and a column resource identification 530 to the column redundant data array 520. The column translation array 515 utilizes the column match identification 525 to present a column offset 570 to the input multiplexer 594. The input multiplexer 594 utilizes the column offset 570 to selectively output one of the eight sets of 8-bits of composite data 595 to the column redundant array 520. The column redundant data array 520 utilizes the column resource identification 530 and a portion, ADDR[9:3] 596, of the address of the memory location within the primary memory array 500 to input column data 580 from the input multiplexer 594 to the column redundant data array 520 in accordance with the read operation.

If the address, ADDR[9:3] 596, ADDR[2:0] 597, and WAY[2:0] 598, of the memory location within the primary memory array 500 is present in the row CAM array 540, the row CAM array 540 presents a row match identification 555 to the row translation array 545 and a row resource identification 560 to the row redundant data array 550. The row translation array 545 utilizes the row match identification 555 to present a row offset 575 to the input multiplexer 594. The input multiplexer 594 utilizes the row offset 575 to selectively output one of four groups of 16-bits of composite data 595 to the row redundant data array 550. The row redundant data array 550 utilizes the row resource identification 560 and a portion, part of WAY[2:0] 598, of the address of the memory location within the primary memory array 500 to input row data 585 from the input multiplexer 594 to the row redundant array 550 in accordance with the write operation.

One of ordinary skill in the art will appreciate that data from the column redundant data array and the row redundant data array could be input as part of the same write operation in accordance with one or more embodiments of the present invention.

Figure 6:
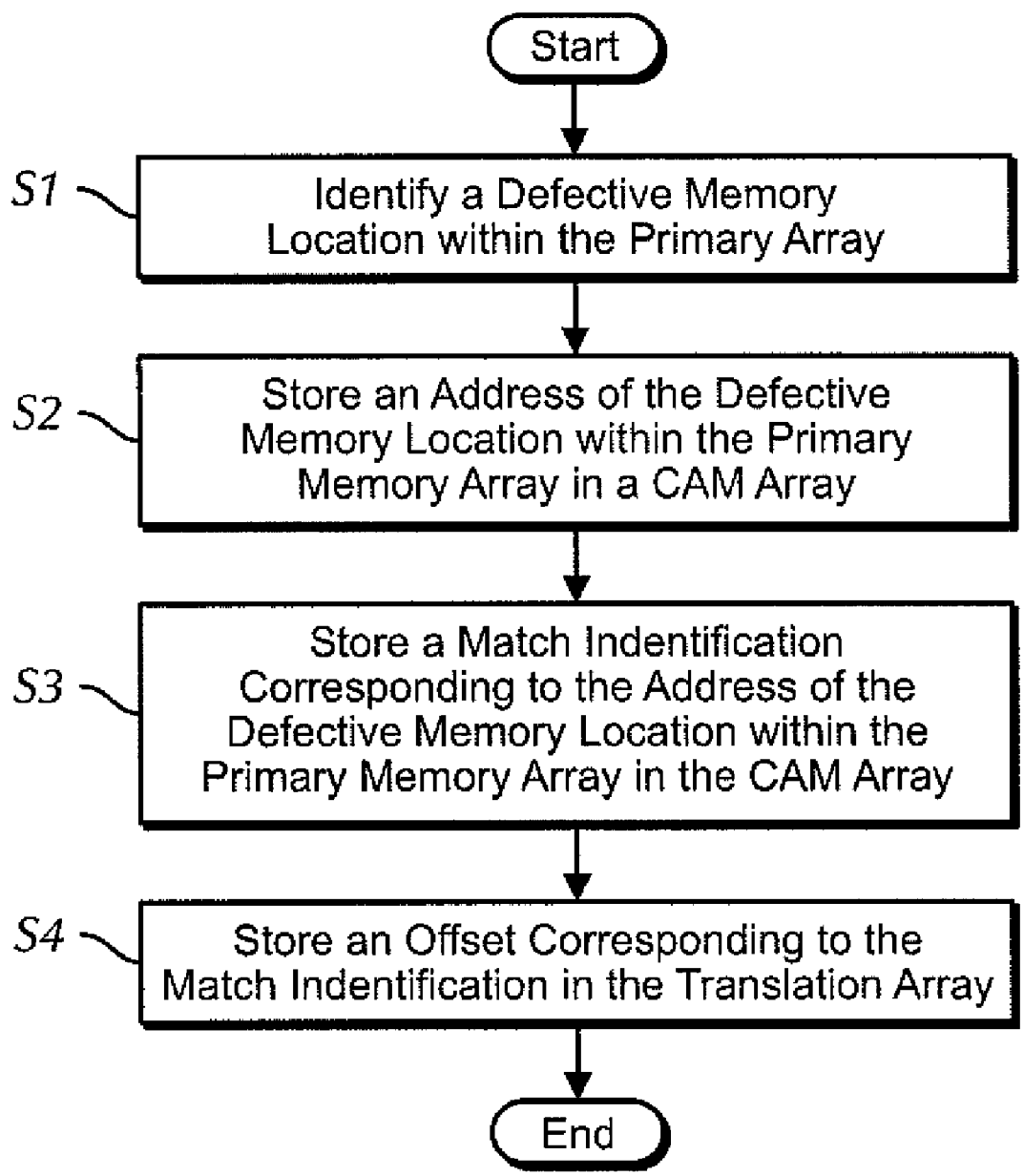
FIG. 6 shows a method of configuring a redundant array for redundancy of a memory array in accordance with an embodiment of the present invention.

FIG. 6 shows a method for configuring a redundant array for redundancy of a memory array in accordance with one or more embodiments of the present invention.

In S1, a defective memory location within a primary memory array is identified. A defective memory location means a memory location that is defective from an inherent defect incurred during the fabrication process or a memory location that fails to meet minimum electrical requirements. A defective memory cell could be identified through the use of a Built-In Self Test (BIST) mechanism within the device that contains the memory array. One of ordinary skill in the art will appreciate that a defective memory cell could be identified through various other manners in accordance with one or more embodiments of the present invention.

In S2, an address of the defective memory location within the primary memory array is stored in a CAM array. One of ordinary skill in the art will appreciate that the CAM array is an associative array in which the array is addressed by search data. In this case, the search data is the address of the defective memory location within the primary memory array.

In S3, a match identification corresponding to the address of the defective memory location within the primary memory array is stored in the CAM array. Thus, when an address of a defective memory location within the primary memory array is presented to the CAM array, if the address is present in the CAM array, the CAM array returns the corresponding match identification.

In S4, an offset corresponding to the match identification is stored in a translation array.

One of ordinary skill in the art will appreciate that steps S1 through S4 could be repeated as necessary to identify all defective memory locations within the primary memory array.

Figure 7:
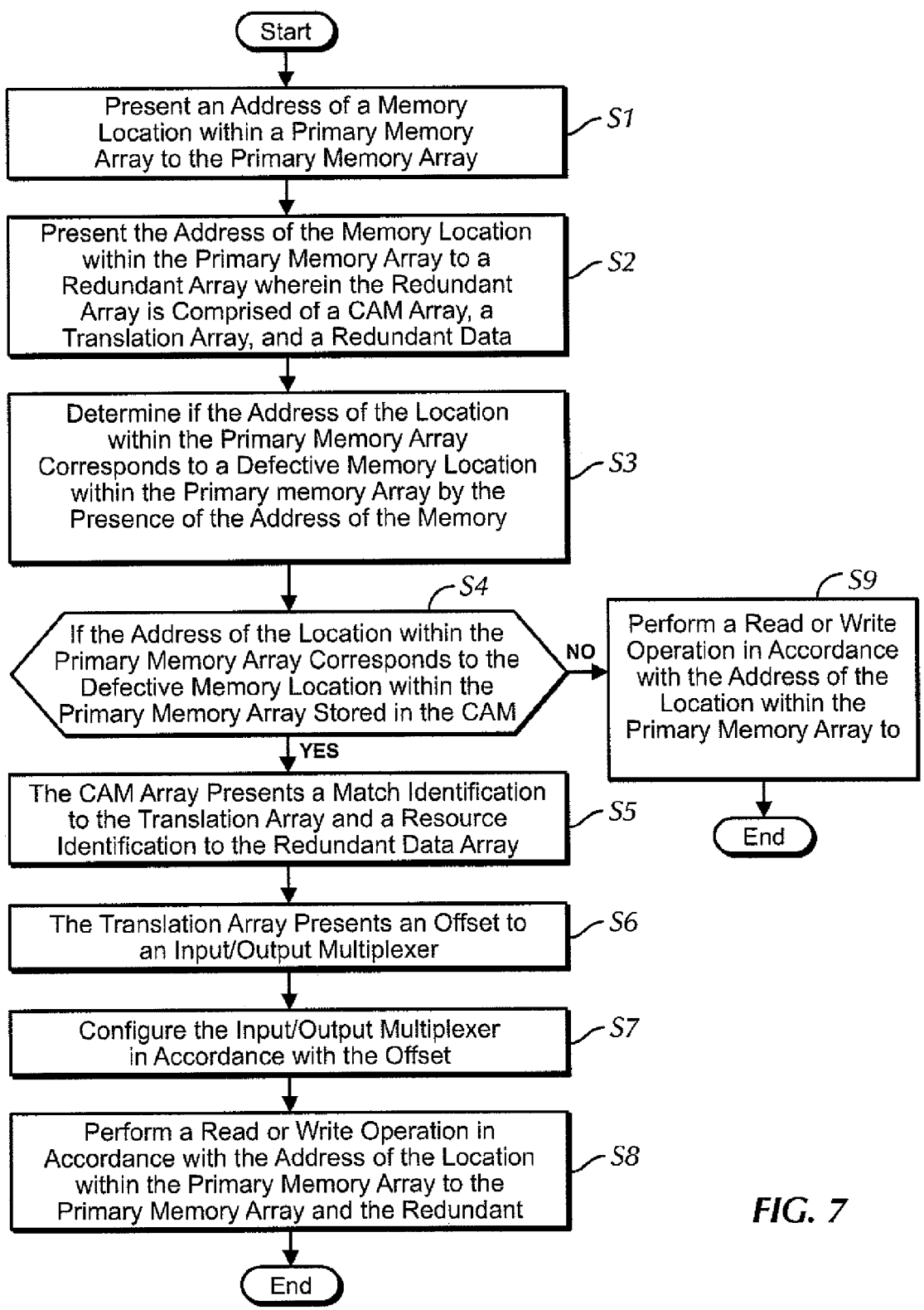
FIG. 7 shows a method for redundancy of a memory array in accordance with an embodiment of the present invention.

FIG. 7 shows a method for memory redundancy in accordance with one or more embodiments of the present invention.

In S1, an address of a memory location within a primary memory array is presented to the primary memory array. The address is comprised of enough bits to uniquely identify the memory location within the primary memory array. One of ordinary skill in the art will appreciate that the address is presented as part of a read or write operation.

In S2, the address of the memory location within the primary memory array is presented to a redundant array. The redundant array is comprised of a CAM array, a translation array, and a redundant array. One of ordinary skill in the art will appreciate that the address is presented as part of the read or write operation.

In S3, a determination is made as to whether the address of the memory location within the primary memory array corresponds to a defective memory location within the primary memory by the presence of the address of the memory location within the primary array in the CAM array. One of ordinary skill in the art will appreciate that the address of defective memory locations within the primary array could be configured in the CAM array in accordance with the method shown in FIG. 6.

In S4, an evaluation is made as to whether the address of the memory location within the primary array corresponds to the defective memory location within the primary memory array stored in the CAM array. One of ordinary skill in the art will appreciate that presenting the address of the memory location within the primary array to the CAM array results in a match or not, which could form the basis for the evaluation.

In S5, upon an affirmative evaluation that the address of the memory location within the primary array corresponds to the defective memory location within the primary memory array stored in the CAM array, the CAM array presents a match identification to the translation array and a resource identification to the redundant data array.

In S6, the translation array presents an offset to the input/output multiplexer.

In S7, the input/output multiplexer is configured in accordance with the offset. The input/output multiplexer could be configured to utilize some, all, or none of the read or write data from or to the redundant data array.

In S8, the primary memory array, redundant array, and input/output multiplexer are appropriately addressed and configured. Thus, a read or write operation in accordance with the location within the primary memory array is directed to the primary memory array and the redundant data array.

In S9, upon a negative evaluation that the address of the memory location within the primary array corresponds to the defective memory location within the primary memory array stored in the CAM array, a read or write operation in accordance with the address of the location within the primary memory array is directed to the primary memory array.

Figure 8:
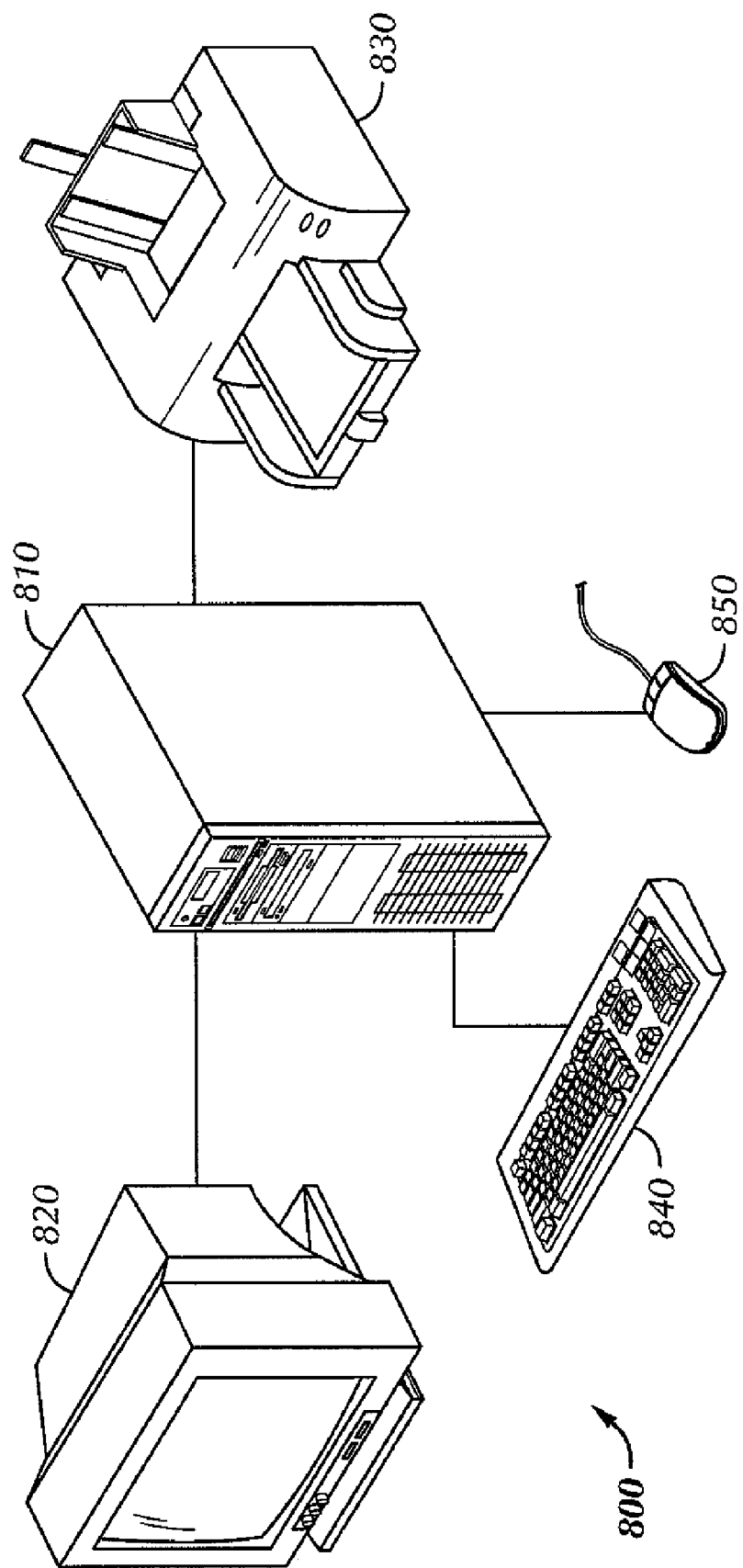
FIG. 8 shows an apparatus for column and row redundancy of a memory array disposed in a system in accordance with an embodiment of the present invention.

FIG. 8 shows an apparatus for column and row redundancy of a memory array disposed in a computer system in accordance with one or more embodiments of the present invention.

A computer system 800 includes several components that are collectively used by a user to perform various functions such as, for example, generating a document with a word processor. The user may input data to a computing portion 810 using peripheral devices such as a keyboard 840 or a mouse 850. Data may also be provided to the computing portion 810 using data storage devices (e.g., a floppy disk, fixed disk, flash device, CD, DVD, etc.). The computing portion 810, using memory and other internal components, processes both internal data and data provided to the computing portion 810 by the user to generate data requested by the user. The generated data may be provided to the user via a display device 820 or a printer 830.

The computing portion 810 typically includes various components such as one or more power supplies, one or more data storage devices, one or more microprocessors, and one or more circuit boards containing circuitry required to perform the necessary and requested operations of the computer system 800. Those skilled in the art will appreciate that one or more elements of the computer system 800 may take various other forms and may be located at a remote location and connected to the other elements over a network.

Those skilled in the art, having the benefit of this detailed description, will appreciate that the method and apparatus for memory redundancy may be used advantageously to provide redundancy for defective memory cells within a primary memory array. Advantages of one or more embodiments of the present invention may include one or more of the following.

In one or more embodiments of the present invention, the method and apparatus for memory redundancy is more efficient and flexible because it provides soft programmable repair resources. Software may be used to program repairs during production testing or anytime during the lifetime of the product.

In one or more embodiments of the present invention, the method and apparatus for memory redundancy is more efficient and flexible because the repair resources may be shared without a fixed address space. As such, redundant memory elements may be shared by a larger memory space than typical shift register schemes, and as a consequence, improve the yield.

In one or more embodiments of the present invention, the method and apparatus for memory redundancy provides for improved granularity of repair. Memory redundancy may be provided for a portion of a memory array line instead of replacing the entire memory array line. Additionally, different sections of the memory array line may be repaired by row redundancy, column redundancy, or both.

In one or more embodiments of the present invention, the method and apparatus for memory redundancy may be used advantageously wherein the primary memory array and redundant array share the same address space.

In one or more embodiments of the present invention, the method and apparatus for memory redundancy may be used advantageously without negatively impacting memory timing or performance.

In one or more embodiments of the present invention, the method and apparatus for memory redundancy may be used advantageously to minimize the area and routing overhead required to implement a redundancy scheme.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. An apparatus for redundancy of a memory array comprising:
   a primary memory array comprising a plurality of memory cells wherein one or more memory cells of the primary array are defective;
   a redundant array comprising:
      a CAM array comprising a plurality of memory cells,
         wherein the addresses of the one or more defective memory locations within the primary array are stored,
         wherein the CAM array is addressed by the addresses of the one or more defective memory locations within the primary memory array, and
         wherein the CAM array provides a match identification to a translation array and a resource identification to a redundant data array,
      the translation array,
         wherein an offset that configures an input/output multiplexer is stored,
         wherein the translation array provides the offset to the input/output multiplexer,
      the redundant data array comprising a plurality of memory cells,
         wherein one or more memory cells of the redundant data array are used instead of one or more defective memory cells of the primary array; and
      the input/output multiplexer wherein the input/output multiplexer selectively presents data comprised of data from or to the primary memory array or data from or to the primary memory array and the redundant array.

2. The apparatus of claim 1, wherein the CAM array and translation array are configured prior to the operation of the redundant array.

3. The apparatus of claim 1, wherein the resource identification is the match identification.

4. The apparatus of claim 1, wherein the translation array could be comprised of a register file.

5. The apparatus of claim 1, wherein the input/output multiplexer could be comprised of a plurality of multiplexers.

6. The apparatus of claim 1, wherein the apparatus is disposed in a microprocessor, ASIC, FPGA, or other semiconductor device.

7. The apparatus of claim 6, wherein the primary memory array is an instruction or data cache.

8. The apparatus of claim 6, wherein the microprocessor, ASIC, FPGA, or other semiconductor device is disposed in a system.

9. The apparatus of claim 7, wherein the semiconductor is disposed in a computer system comprising a display device, an input device, and a computing apparatus.

10. A method for configuring a redundant array for redundancy of a memory array comprising:
- identifying a defective memory cell within a primary memory array;
- storing an address corresponding to the address of the defective memory cell within the primary memory array in a CAM array;
- storing a match identification corresponding to the address of the defective memory cell within the primary memory array in the CAM array;
- storing a resource identification corresponding to the match identification in the CAM array; and
- storing an offset corresponding to the resource identification in a translation array.

11. The method of claim 10, wherein the translation array could be comprised of a register file.

12. The method of claim 10, further comprising identifying the defective memory cell through the use of a built-in self-test (BIST).

13. A method for redundancy of a memory array comprising:
- presenting an address of a memory location within a primary memory array to the primary memory array;
- presenting the address of the memory location within the primary memory array to a redundant array wherein the redundant array is comprised of a CAM array, a translation array, and a redundant data array;
- determining whether the address of the memory location within the primary memory array corresponds to a defective memory location within the primary memory array;
- if the address of the memory location within the primary memory array corresponds to the defective memory location within the primary memory array,
  - presenting a match identification from the CAM array to the translation array,
  - presenting a resource identification from the CAM array to the redundant data array,
  - presenting an offset that corresponds to the resource identification from the translation array to an input/output multiplexer,
  - configuring the input/output multiplexer in accordance with the offset,
  - performing a read or write operation in accordance with the address of the memory location within the primary memory array to the redundant data array;
- performing the read or a write operation in accordance with the address of the memory location within the primary memory array to the primary memory array; and
- presenting data corresponding to the address of the memory location within the primary memory array in accordance with the read or write operation.

14. The method of claim 13, wherein the resource identification is the match identification.

15. The method of claim 13, wherein the method is utilized for column redundancy.

16. The method of claim 13, wherein the method is utilized for row redundancy.

17. The method of claim 13, wherein the method is utilized for column and row redundancy.

18. The method of claim 13, wherein the address of the memory location comprises a row address and a column address.

19. The method of claim 18, wherein the address of the memory location further comprises a way address.

20. The method of claim 13, wherein the determination is made by the presenting of the address of the memory location within the primary memory array to the CAM array.

* * * * *